(12) United States Patent
Liu et al.

(10) Patent No.: US 6,559,751 B2
(45) Date of Patent: May 6, 2003

(54) INDUCTOR DEVICE

(75) Inventors: Shen-Iuan Liu, Keelung (TW); Chia-Hsin Wu, Shu-Lin (TW)

(73) Assignee: Archic Tech. Corp., Taipei (TW)

(*) Notice: Subject to any disclaimer, the term of this patent is extended or adjusted under 35 U.S.C. 154(b) by 0 days.

(21) Appl. No.: 09/970,237

(22) Filed: Oct. 2, 2001

(65) Prior Publication Data

US 2002/0101322 A1 Aug. 1, 2002

(30) Foreign Application Priority Data

Jan. 31, 2001 (TW) ............................ 90101948

(51) Int. Cl.[7] ................................................ H01F 5/00
(52) U.S. Cl. ........................ 336/223; 336/200; 336/232
(58) Field of Search .............................. 336/200, 223, 336/232

(56) References Cited

U.S. PATENT DOCUMENTS 4,816,784 A * 3/1989 Rabjohn .................... 333/24 R
4,992,769 A * 2/1991 Oppelt ....................... 336/180
5,610,433 A * 3/1997 Merrill et al. ............... 257/531
5,969,590 A * 10/1999 Gutierrez .................... 336/200
6,204,745 B1 * 3/2001 Liu et al. .................... 336/223

* cited by examiner

Primary Examiner—Anh Mai
(74) Attorney, Agent, or Firm—Merchant & Gould P.C.

(57) ABSTRACT

The present invention provides an inductor device with a first input/output terminal and a second input/output terminal. The inductor device comprises a first coil and a second coil. The first coil has a first inner coil and a first outer coil surrounding the first inner coil. The first inner coil has a first connect portion connecting to the first input/output terminal and a second connect portion. The first outer coil has a third connect portion and a fourth connect portion connecting to the second input/output terminal. The second coil located has a second inner coil and a second outer coil surrounding the second inner coil. The second inner coil has a fifth connect portion and a sixth connect portion connecting to the second connect portion. The second outer coil has a seventh connect portion connecting to the fifth connect portion and a eighth connect portion connecting to the third connect portion.

13 Claims, 6 Drawing Sheets

INDUCTOR DEVICE

BACKGROUND OF THE INVENTION

1. Field of the Invention

The present invention relates in general to an inductor device. In particular, the present invention relates to an inductor device for CMOS RF pre-stage circuits fabricated by semiconductor processes.

2. Description of the Related Art

Recently, CMOS technology has become more popular in circuit design, due to the integration of CMOS. When designing CMOS radio frequency circuits, control of inductor characteristics is very important.

FIG. 1 is a top view of a conventional planar inductor. FIG. 2 is a section view of a conventional planar inductor. The conventional planar inductor uses the top metal layer of a semiconductor device comprising coils in a predetermined direction. In the design of conventional planar inductors, the radius of the planar inductor should exceed 30 um and the loop count three to achieve the desired inductance for circuits. However, increasing the loop count of the inductor will cause an increase in the size of the inductor. Therefore, designers decrease the radius of the planar inductor to keep the size of conventional planar inductors smaller.

However, decreasing the radius of the planar inductor decreases inductance and lowers the quality of the inductor by intensifying the occurrence of eddy currents.

If the design increases the loop count of the inductor to increase inductance, eddy currents will be more pronounced, negatively impacting the quality of the inductor.

Moreover, conventional multi-layer inductor layout deposes multiple coils on one layer. If designers want to increase the inductance of the inductor, more coils must be deposed on other layers. This way will, however, increase the length of the current path and cause an increase in the voltage difference between the layers. Consequently, the capacitance of the inductor between the two layers increases, and the self-resonant frequency of the inductor is lowered.

SUMMARY OF THE INVENTION

The object of the present invention is to provide a multi-layer inductor to solve the problems mentioned above. The inductor according to the present invention exhibits a marked increase in the inductance to unit area ratio. Incidentally, the inductor of the present invention is smaller than conventional inductors of identical quality.

Moreover, inductance of the inductor according to the present invention is increased due to mutual induction between inner-portion coils and outer-portion coils. Therefore, the problem of low self-resonant frequency seen in conventional inductors is eliminated, and the size and cost of the RF circuit is decreased commensurately.

To achieve the above-mentioned object, the present invention provides an inductor device with both a first input/output terminal and a second input/output terminal. The inductor device comprises a first coil and a second coil. The first coil has a first inner coil and a first outer coil surrounding the first inner coil. The first inner coil has a first connect portion connecting to the first input/output terminal and a second connect portion. The first outer coil has a third connect portion and a fourth connect portion connecting to the second input/output terminal. The second coil location has a second inner coil and a second outer coil surrounding the second inner coil. The second inner coil has a fifth connect portion and a sixth connect portion connecting to the second connect portion. The second outer coil has a seventh connect portion connecting to the fifth connect portion and a eighth connect portion connecting to the third connect portion.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENT

First Embodiment

Figure 1:
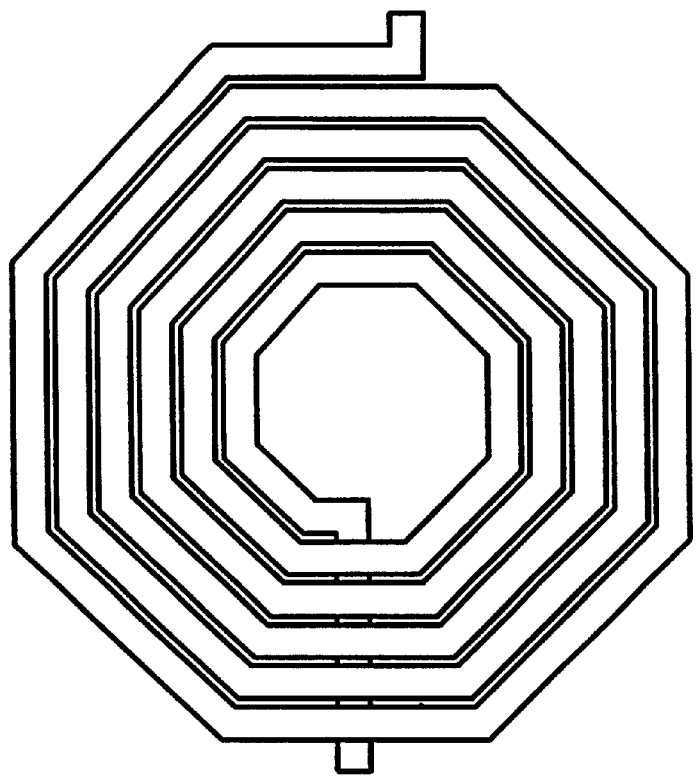
FIG. 1 is a top view of a conventional planar inductor.
Figure 2:
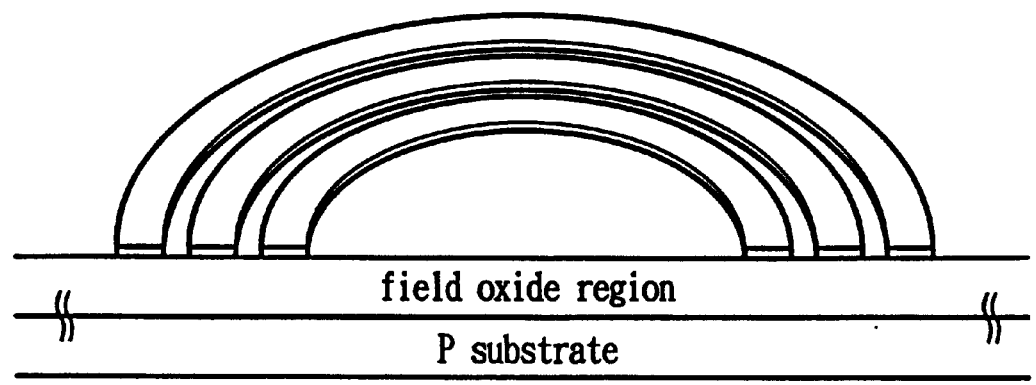
FIG. 2 is a section view of the conventional planar inductor.
Figure 3:
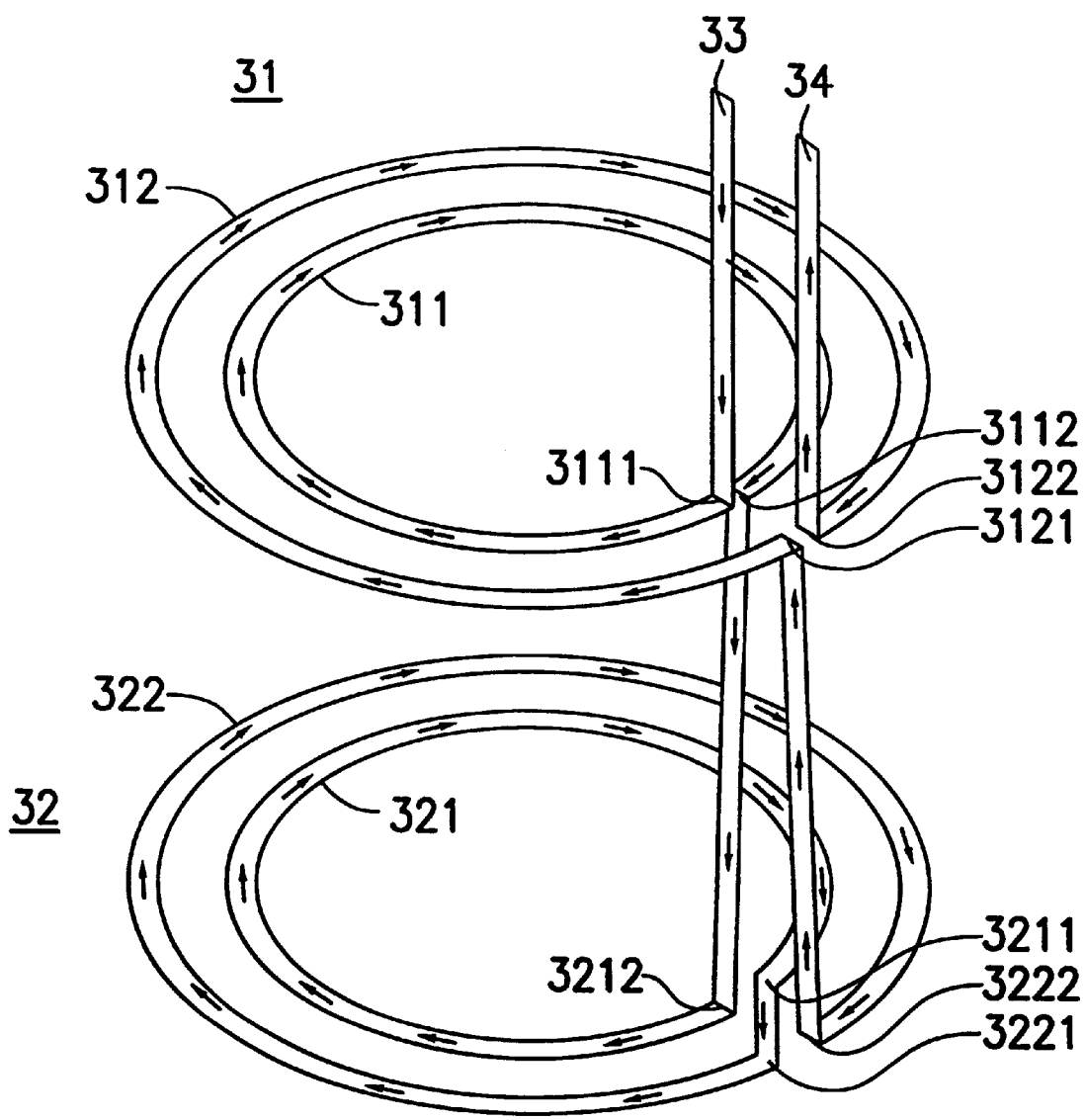
FIG. 3 is a structural drawing of the inductor according to the first embodiment of the present invention.

FIG. 3 shows a structural drawing of the inductor device according to the first embodiment of the present invention. The inductor device according to the first embodiment of the present invention comprises a first coil 31 and a second coil 32.

The first coil 31 is located on a first plane. The first coil 31 has a first inner coil 311 and a first outer coil 312 surrounding the first inner coil 311. The first inner coil 311 has a first connect portion 3111 connecting to the first input/output terminal 33 and a second connect portion 3112, and the first outer coil 312 has a third connect portion 3121 and a fourth connect portion 3122 connecting to the second input/output terminal 34.

In addition, a second coil 32 is located on a second plane, which is different from the first plane (as shown in FIG. 3). The second coil has a second inner coil 321 and a second outer coil 322 surrounding the second inner coil 321. The second inner coil 321 has a fifth connect portion 3211 and a sixth connect portion 3212 connecting to the second connect portion 3112, and the second outer coil 322 has a seventh connect portion 3221 connecting to the fifth connect portion 3211 and an eighth connect portion 3222 connecting to the third connect portion 3121.

Moreover, the inductor device according to the first embodiment of the present invention is fabricated by semiconductor process technology, and the first coil 31 and the second coil 32 are incorporated in the mold.

Second Embodiment

Figure 4:
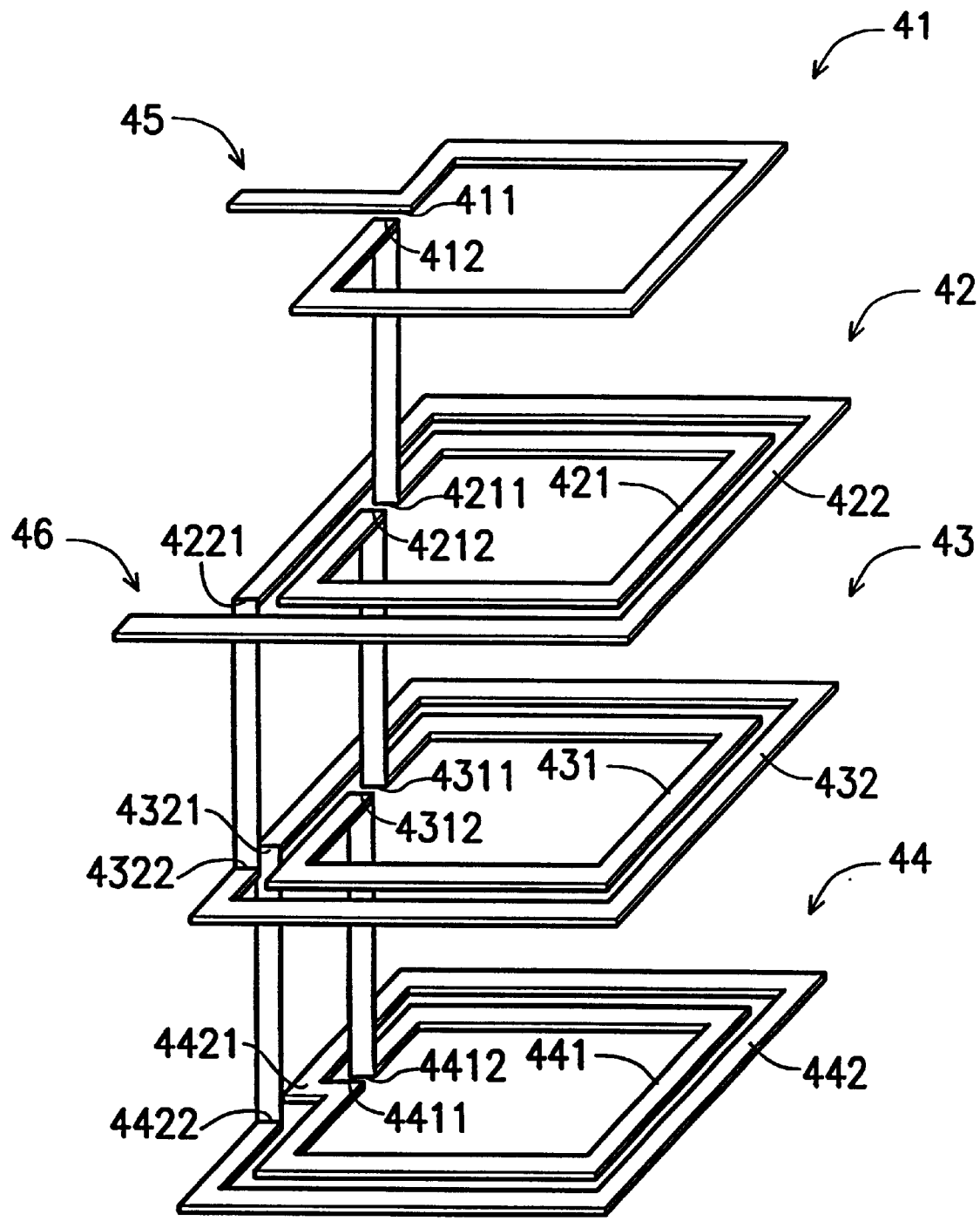
FIG. 4 is a structural drawing of the inductor according to the second embodiment of the present invention.

FIG. 4 shows a structural drawing of the inductor device according to the second embodiment of the present invention. The inductor device according to the second embodiment of the present invention is fabricated by semiconductor process technology.

The inductor device comprises a first rectangular coil 41, a second rectangular coil 42, a third rectangular coil 43 and a fourth rectangular coil 44, and the first rectangular coil 41, the second rectangular coil 42, a third rectangular coil 43 and a fourth rectangular coil 44 are incorporated in the mold.

The first rectangular coil 41 has a first connect portion 411 connecting to the first input/output terminal 45 and a second connect portion 412.

The second rectangular coil 42 has a first inner rectangular coil 421 and a first outer rectangular coil 422 surrounding the first inner rectangular coil 421. The first inner rectangular coil 421 has a third connect portion 4211 connecting to the second connect portion 412 and a fourth connect portion 4212, and the first outer rectangular coil 422 has a fifth connect portion 4221 and a sixth connect portion 4222 connecting to the second input/output terminal 46.

The third rectangular coil has a second inner rectangular coil 431 and a second outer rectangular coil 432 surrounding the second inner rectangular coil 431. The second inner rectangular coil 431 has a seventh connect portion 4311 connecting to the fourth connect portion 4212 and a eighth connect portion 4312, and the second outer rectangular coil 432 has a ninth connect portion 4321 and a tenth connect portion 4322 connecting to the fifth connect portion 4221.

The fourth rectangular coil 44 has a third inner rectangular coil 441 and a third outer rectangular coil 442 surrounding the third inner rectangular coil 441. The third inner rectangular coil 441 has a twelfth connect portion 4411 and a eleventh connect portion 4412 connecting to the eighth connect portion 4312, and the third outer rectangular coil 442 has a thirteenth connect portion 4421 connecting to the twelfth connect portion 4411 and a fourteenth connect portion 4422 connecting to the ninth connect portion 4321. Incidentally, the first rectangular coil 41, second rectangular coil 42, third rectangular coil 43 and fourth rectangular coil 44 are located on different planes.

Third Embodiment

Figure 5:
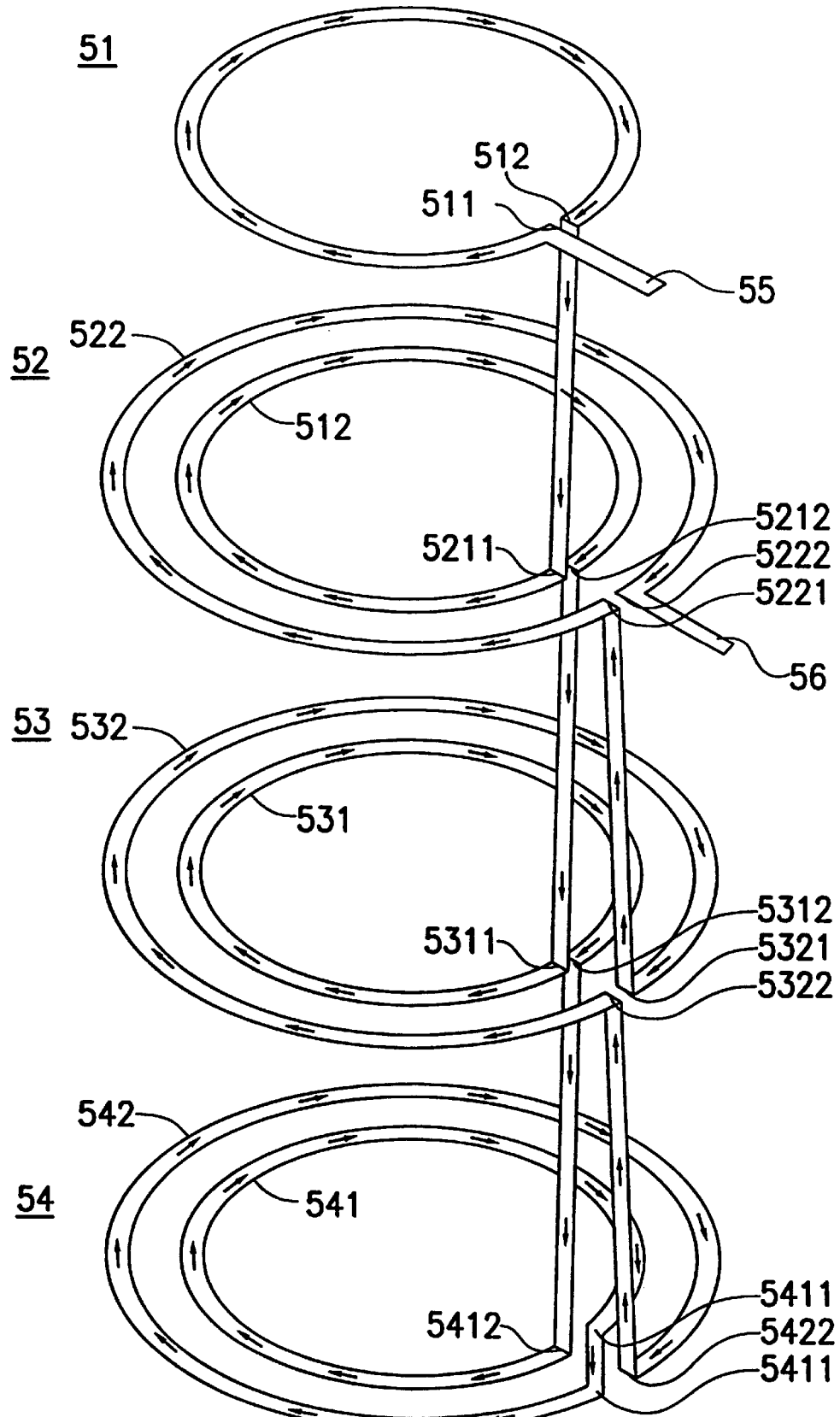
FIG. 5 is a structural drawing of the inductor according to the third embodiment of the present invention.

FIG. 5 is a structural drawing of the inductor device according to the third embodiment of the present invention. The inductor device according to the third embodiment of the present invention is fabricated by semiconductor process technology.

The inductor device comprises a first circular coil 51, a second circular coil 52, a third circular coil 53 and a fourth circular coil 54, and the first circular coil 51, the second circular coil 52, a third circular coil 53 and a fourth circular coil 54 are incorporated in the mold.

The first circular coil 51 has a first connect portion 511 connecting to the first input/output terminal 55 and a second connect portion 512.

The second circular coil 52 has a first inner circular coil 521 and a first outer circular coil 522 surrounding the first inner circular coil 521. The first inner circular coil 521 has a third connect portion 5211 connecting to the second connect portion 512 and a fourth connect portion 5212, and the first outer circular coil 522 has a fifth connect portion 5221 and a sixth connect portion 5222 connecting to the second input/output terminal 56.

The third circular coil has a second inner circular coil 531 and a second outer circular coil 532 surrounding the second inner circular coil 531. The second inner circular coil 531 has a seventh connect portion 5311 connecting to the fourth connect portion 5212 and a eighth connect portion 5312, and the second outer circular coil 532 has a ninth connect portion 5321 and a tenth connect portion 5322 connecting to the fifth connect portion 5221.

The fourth circular coil 54 has a third inner circular coil 541 and a third outer circular coil 542 surrounding the third inner circular coil 541. The third inner circular coil 541 has a twelfth connect portion 5411 and a eleventh connect portion 5412 connecting to the eighth connect portion 5312, and the third outer circular coil 542 has a thirteenth connect portion 5421 connecting to the twelfth connect portion 5411 and a fourteenth connect portion 5422 connecting to the ninth connect portion 5321. Incidentally, the first circular coil 51, second circular coil 52, third circular coil 53 and fourth circular coil 54 are located on different planes.

Therefore, the voltage difference between coils on different planes will be decreased by the design according to the embodiments of the present invention, and the capacitance in the inductor will be decreased.

Figure 6:
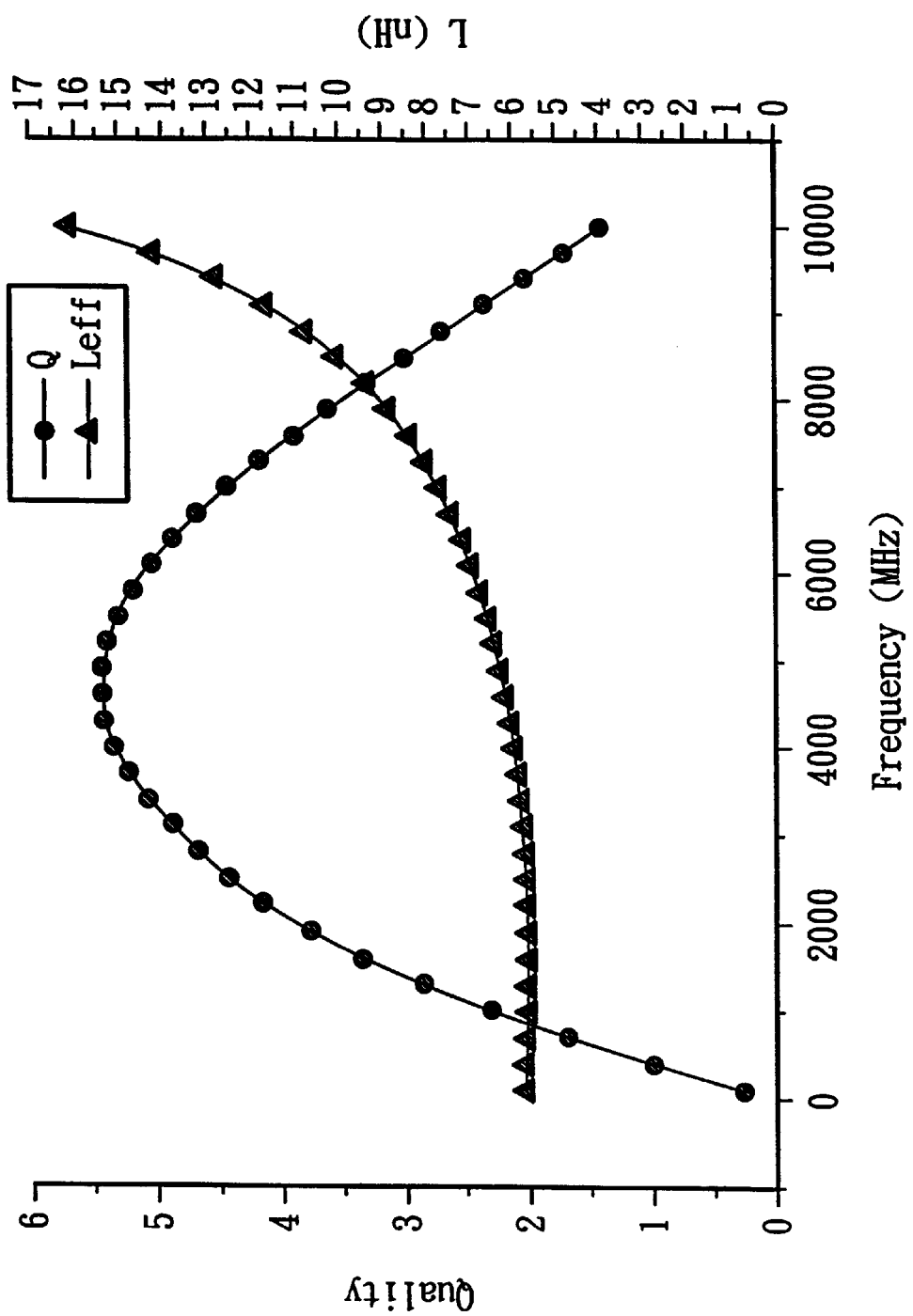
FIG. 6 is a plot of inductance and quality factor against frequency according to the inductor of the present invention.
Figure 7:
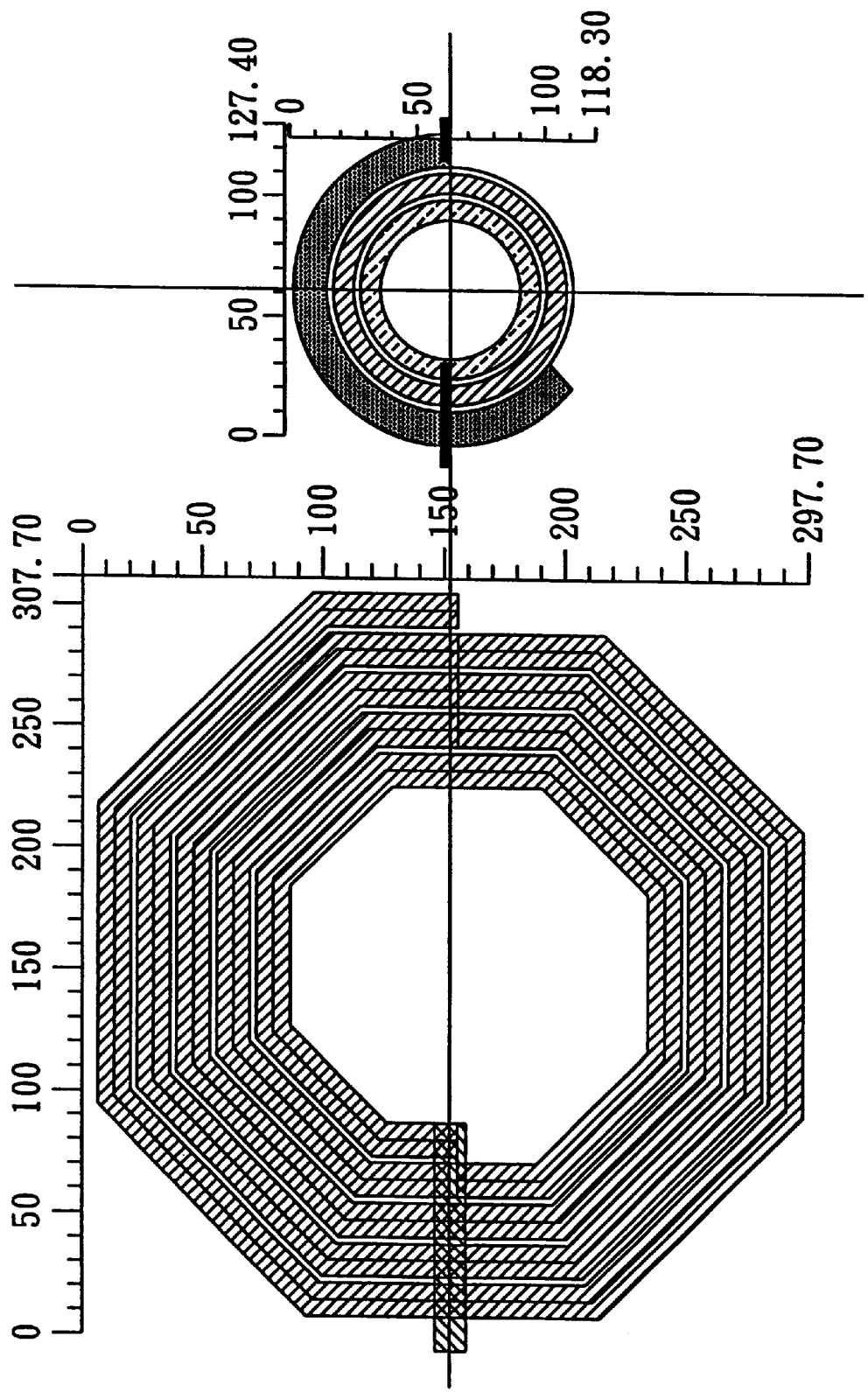
FIG. 7 shows the layer area of the inductor of the present invention and conventional inductor.

The test result of the inductor according to present invention is illustrated below. Here, the inductor is fabricated by TSMC 0.35 micrometer Single-poly Four-metal P-substrate process. FIG. 6 is a plot of inductance and quality against frequency according to the inductor of the present invention, which is tested by National Nano Device Laboratories (NDL). FIG. 7 shows the layer area of the inductor of the present invention and a conventional inductor. As shown FIG. 7, the left-part of FIG. 7 shows the layout of the conventional inductor, and the right-part of FIG. 7 shows the layout of the inductor of the present invention. In FIG. 7, the layout area of the inductor of present invention is decreased 80% than conventional inductor, and the self-oscillate frequency is raised to about 10 GHz. Therefore, the inductor can be used in GSM, DETC, Bluetooth and HIPERLAN environments, and improves the operating frequency of the inductor.

Accordingly, the inductor according to the present invention exhibits a marked increase in the inductance to unit area ratio. Incidentally, the inductor of the present invention is smaller than conventional inductors of identical quality.

Moreover, inductance of the inductor according to the present invention is increased due to mutual induction between inner-portion coils and outer-portion coils. Thus, the problem of low self-resonant frequency seen in conventional inductors is eliminated, and the size and cost of the RF circuit is decreased.

Accordingly, Compare to the conventional inductor, the inductor of the present invention has the advantages no matter in small area or quality factor. Although the stacked inductor also can use the small area to achieve the required inductance, the stacked inductor suffers from the low self-resonance frequency. The inductor of the present invention is proposed to improve the self-resonance frequency without enlarging the size.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. An inductor device with a first input/output terminal and a second input/output terminal, comprising:
   a first coil located on a first plane, the first coil having a first inner coil and a first outer coil surrounding the first inner coil, the first inner coil having a first connect portion connecting to the first input/output terminal and a second connect portion, and the first outer coil having a third connect portion and a fourth connect portion connecting to the second input/output terminal; and a second coil located on a second plane, the second coil having a second inner coil and a second outer coil surrounding the second inner coil, the second inner coil having a fifth connect portion and a sixth connect portion connecting to the second connect portion, and the second outer coil having a seventh connect portion connecting to the fifth connect portion and a eighth connect portion connecting to the third connect portion.

2. The inductor device as claimed in claim 1, wherein the first coil and the second coil are incorporated in the mold.

3. The inductor device as claimed in claim 2 is fabricated by semiconductor process technology.

4. The inductor device as claimed in claim 3, wherein the first coil and the second coil are made of metal.

5. The inductor device as claimed in claim 4, wherein the first coil and the second coil are circular coils.

6. The inductor device as claimed in claim 4, wherein the first coil and the second coil are rectangular coils.

7. An inductor device with a first input/output terminal and a second input/output terminal, comprising:

a first coil having a first connect portion connecting to the first input/output terminal and a second connect portion;

a second coil having a first inner coil and a first outer coil surrounding the first inner coil, the first inner coil having a third connect portion connecting to the second connect portion and a fourth connect portion, and the first outer coil having a fifth connect portion and a sixth connect portion connecting to the second input/output terminal;

a third coil having a second inner coil and a second outer coil surrounding the second inner coil, the second inner coil having a seventh connect portion connecting to the fourth connect portion and a eighth connect portion, and the second outer coil having a ninth connect portion and a tenth connect portion connecting to the fifth connect portion; and a fourth coil having a third inner coil and a third outer coil surrounding the third inner coil, the third inner coil having a twelfth connect portion and a eleventh connect portion connecting to the eighth connect portion, and the third outer coil having a thirteen connect portion connecting to the twelfth connect portion and a fourteen connect portion connecting to the ninth connect portion.

8. The inductor device as claimed in claim 7, wherein the first coil, the second coil, the third coil and the fourth coil are located on different planes.

9. The inductor device as claimed in claim 8, wherein the first coil, the second coil, the third coil and the fourth coil are incorporated in the mold.

10. The inductor device as claimed in claim 9, wherein the inductor device is fabricated by semiconductor process technology.

11. The inductor device as claimed in claim 10, wherein the first coil, the second coil, the third coil and the fourth coil are made of metal.

12. The inductor device as claimed in claim 11, wherein the first coil, the second coil, the third coil and the fourth coil are circular coils.

13. The inductor device as claimed in claim 12, wherein the first coil, the second coil, the third coil and the fourth coil are rectangular coils.

* * * * *